(12) United States Patent
Katsuhiko et al.

(10) Patent No.: US 7,773,196 B2
(45) Date of Patent: Aug. 10, 2010

(54) PROJECTION-OPTICAL SYSTEMS AND EXPOSURE APPARATUS COMPRISING SAME

(75) Inventors: Murakami Katsuhiko, Sagamihara (JP); Komiya Takaharu, Yokohama (JP)

(73) Assignee: Nikon Corporation, Tokyo (JP)

( * ) Notice: Subject to any disclaimer, the term of this patent is extended or adjusted under 35 U.S.C. 154(b) by 807 days.

(21) Appl. No.: 11/704,427

(22) Filed: Feb. 8, 2007

(65) Prior Publication Data
US 2007/0222964 A1   Sep. 27, 2007

Related U.S. Application Data

(60) Provisional application No. 60/785,867, filed on Mar. 24, 2006.

(30) Foreign Application Priority Data

Mar. 10, 2006  (JP) .............................. 2006-066583

(51) Int. Cl.
- G03B 27/54 (2006.01)
- G03B 27/42 (2006.01)
- G02B 5/08 (2006.01)
- G02B 5/10 (2006.01)
- G21K 5/00 (2006.01)

(52) U.S. Cl. .............................. 355/67; 355/53; 378/34; 359/359; 359/859

(58) Field of Classification Search .................. 355/53, 355/67; 378/34, 35; 359/359, 360, 361, 359/850, 857, 858, 859; 430/331
See application file for complete search history.

(56) References Cited

U.S. PATENT DOCUMENTS 6,833,223 B2   12/2004   Shiraishi 6,927,901 B2 *   8/2005   Mann et al. .................. 359/366
7,070,289 B2 *   7/2006   Sasaki et al. ................ 359/859
2005/0147204 A1 *   7/2005   Kondo et al. .................. 378/34

FOREIGN PATENT DOCUMENTS

JP   H6-148399   5/1994

OTHER PUBLICATIONS

Tichenor et al., "Recent results in the development of an integrated EUVL laboratory tool," Proceedings of SPIE, vol. 2437, pp. 292-307, Feb. 20-21, 1995.

Louis et al., "Multilayer optics with spectral purity layers for the EUV wavelength range," Proceedings of SPIE, vol. 6151, pp. 61539-1 to 615139-5, 2006.

* cited by examiner

Primary Examiner—Alan A Mathews
(74) Attorney, Agent, or Firm—Klarquist Sparkman, LLP

(57) ABSTRACT

Projection-optical systems are disclosed that reduce OoB radiation doses on the wafer while reducing deterioration of optical properties of the systems. An exemplary system includes a first reflector having a reflectance for light of a second predetermined wavelength, different from light of a first predetermined wavelength, that is less than a predetermined reflectance. The system also includes a second reflector having a reflectance for light of the second wavelength which is greater than the predetermined reflectance. When the reflectors in the system are classified as reflectors having a high percentage of overlap for the reflecting regions corresponding to two different points on the wafer, and reflectors having a low percentage of overlap for the reflecting regions, then, among the reflectors having a lower percentage of overlap for the reflecting regions, the most upstream reflector in the light path of the system is the second reflector.

78 Claims, 6 Drawing Sheets

PROJECTION-OPTICAL SYSTEMS AND EXPOSURE APPARATUS COMPRISING SAME

CROSS REFERENCE TO RELATED APPLICATIONS

This application corresponds to, and claims the benefit of, U.S. Provisional Application No. 60/785,867, filed on Mar. 24, 2006, which claims priority under 35 U.S.C. §119(a) to prior Japan Patent Application No. 2006-066583, filed on Mar. 10, 2006, both of which are incorporated herein by reference in their entirety.

FIELD

This disclosure relates to projection-optical systems and exposure apparatus comprising a projection-optical system.

BACKGROUND

At present, reduction projection-exposure methods that achieve high processing speeds are widely used in the manufacture of semiconductor integrated circuits. In recent years, with ongoing miniaturization of semiconductor integrated-circuit elements, projection lithography using soft X-rays having shorter wavelengths (0.5 to 50 nm) than conventional ultraviolet light, has been developed. Soft X-rays improve the resolving power of optical systems that otherwise are limited by diffraction of light, as described in Tichenor et al., *Proceedings SPIE* 2437:292 (1995). Soft X-ray lithography is also called EUV (extreme ultraviolet) lithography (abbreviated EUVL), which is the name most commonly used now. EUVL is expected to become the lithography technology of the future, offering resolving powers of 50 nm or less. Such resolution currently is not possible using conventional photolithography performed using wavelengths of approximately 190 nm or greater.

Because the index of refraction of materials is very close to one in the EUVL wavelength range, conventional optical elements used for refraction and reflection cannot be used. Consequently, grazing-incidence mirrors (providing total reflection due to their index of refraction being slightly less than 1) and multilayer-film reflectors (which combine and superpose multiple phases of light weakly reflected at layer interfaces) are used. The obtained reflectance is sufficiently high to be useful.

An EUV light source used in an EUVL apparatus radiates light of various wavelengths in addition to EUV wavelengths. Many of the wavelengths (e.g., ultraviolet light, visible light, infrared light, and the like having wavelengths longer than EUV wavelengths) are different from actual EUV light used for exposures. These non-exposure wavelengths are called OoB (out of band) light. If exposure light includes OoB light, the following problems generally occur:

(1) The OoB wavelengths expose the EUV optical systems to excess radiant energy. Absorption of this excess energy by reflectors of the projection-optical system causes the reflectors to exhibit thermal aberrations (e.g., aberrations caused by heat-deformation of the reflector). These aberrations deteriorate the performance of the projection-optical system.

(2) The resist on the wafer to be lithographically exposed have some sensitivity to OoB light. Hence, when certain wavelengths of OoB light (e.g., ultraviolet light and the like) reach the wafer, they produce background exposure "noise." This noise does not help resolve the lithographic pattern on the wafer, has the same effect as flare in photolithography optical systems, reduces the contrast of the lithographic image, and actually deteriorates the resolving power of the EUV optical system.

(3) In addition to providing no beneficial contribution to the EUV lithographic exposure, OoB light reaching the wafer causes heating of the wafer, with consequent thermal expansion of the wafer. Thus, alignment precision of the wafer is degraded and distortion is increased.

Usually, a filter is used to block OoB light. An exemplary OoB-light-blocking filter suitable for use in the EUV-wavelength region is a free-standing film (membrane) type filter. The membrane filter is a very thin (1 micrometer or less) layer of beryllium (Be), zirconium (Zr), or the like, as described in U.S. Pat. No. 6,833,223. Unfortunately, such membrane-type filters are very fragile, are difficult to make in large diameters, and exhibit low transmission of EUV light (approximately 50% or less).

A multilayer-film reflector, which suppresses reflection of OoB light, has been proposed for use as an OoB filter in place of the conventional membrane-type filter in EUV optical systems, as described in Japan Kokai Patent Document No. Hei 6-148399. The multilayer-film reflector includes an anti-reflective layer, disposed on the topmost layer of the multilayer film, to prevent reflection of incident OoB light. Unfortunately, this type of reflector used as a filter not only absorbs more OoB light than a conventional multilayer-film reflector but also absorbs EUV light. Consequently, when using such a reflector as a filter, the intensity of EUV produced by the source must be correspondingly greater to have the same illuminance of EUV light on the wafer otherwise obtained when using a conventional thin-film filter. But, using the EUV projection-optical system with more intense EUV light causes more thermal deformation of the system, increases the aberrations of the system, and degrades the optical performance of the system.

Consequently, there is a need for projection-optical systems that provide reduced OoB radiation on the wafer and that exhibit less deterioration of their optical properties.

SUMMARY

Projection-optical systems as disclosed herein project an image of a pattern on a first surface onto a second surface. An embodiment of such a system comprises a "first" reflector (as defined herein) that has a reflectance for light, of a predetermined wavelength, that is less than a predetermined reflectance. The embodiment also comprises a "second" reflector (as defined herein) that has a reflectance for light, of the predetermined wavelength, that is greater than the predetermined reflectance. The first reflector is positioned, along a light-propagation path extending from the first surface to the second surface, closer than the second reflector to the first surface. By positioning the first reflector in this manner on the first-surface side of the light-propagation path, the first reflector absorbs sufficient light of the predetermined wavelength, which reduces the influence of the light of predetermined wavelength on the reflector that is positioned closer to the second surface than the first reflector.

Another embodiment of a projection-optical projection system projects an image of pattern from a first surface onto a second surface. The system comprises a first reflector that has a reflectance for light, of a predetermined wavelength, that is less than a predetermined reflectance. The system also comprises a second reflector that has a reflectance for light, of the predetermined wavelength, that is greater than the predetermined reflectance. Among the reflectors of this projection-optical system, the reflector situated at a position at which illuminance is highest is the second reflector. With this configuration, deformation of the reflector having the greatest absorption per unit area is reduced because the reflector situated where illuminance is highest is the second reflector.

Another embodiment of a projection-optical system projects an image of a pattern from a first surface onto a second surface. Along a light-propagation path extending from the first surface to the second surface, the system comprises a first reflector that has a reflectance for light, of a predetermined wavelength, that is less than a predetermined reflectance. The system also comprises a second reflector that has a reflectance for light, of the predetermined wavelength, that is greater than the predetermined reflectance. Along the light-propagation path, the second reflector is located in the vicinity of a location at which an intermediate image of the pattern is formed. In this optical system, since a light beam is focused in the vicinity of the location of the intermediate image of the pattern, the illuminance of the reflector situated in that vicinity is high. By placing a second reflector at this vicinity, the radiant energy per unit area absorbed by the reflector is reduced even at high illuminance, which reduces thermal deformation of the reflector.

Another embodiment of a projection-optical system projects an image of a pattern on a first surface onto a second surface. The system comprises a first reflector that has a reflectance for light, of a predetermined wavelength, that is less than a predetermined reflectance. The system also comprises a second reflector that has a reflectance for light, of the predetermined wavelength, that is greater than the predetermined reflectance. In this embodiment a "first point-reflecting region" is a region in which a light beam collected at a predetermined first point on the second surface is reflected on a reflector, a "second point-reflecting region" is a region in which a light beam collected at a second point, different from the first point, on the second surface is reflected on a reflector, and a "common-reflecting region" is a region in which the first point-reflecting region and the second point-reflecting region overlap. Among the reflectors of the system in which the percentage of the common-reflecting region corresponding to the first point-reflecting region is lower than a predetermined percentage, the reflector positioned closest to the first surface, along the light-propagation path from the first surface to the second surface, is the second reflector. Reflectors in which the percentage of the common-reflecting region corresponding to the first point-reflecting region is higher than the predetermined percentage can accommodate thermal deformation caused by radiant heat. In comparison, it is more difficult for reflectors, in which the percentage of the common-reflecting region corresponding to the first point-reflecting region is lower than the predetermined percentage, to accommodate the thermal deformation caused by radiant heat. This embodiment reduces deformation of the reflectors that do not easily accommodate thermal deformation from radiant heat because the reflector, among the reflectors in which the percentage of the common-reflecting region corresponding to the first point-reflecting region is lower than the predetermined percentage, that is positioned closest to the first surface is the second reflector.

Regarding other embodiments of a projection-optical system that projects an image of a pattern from a first surface onto a second surface, certain embodiments comprise a first reflector. The embodiments also comprise a second reflector that has a reflectance for light, of a predetermined wavelength, that is greater than the reflectance of the first reflector for the light of predetermined wavelength. During use of such a system, deterioration of the optical properties of the system is reduced because both the first reflector and the second reflector are included in the system.

An exposure apparatus as disclosed herein comprises any of the projection-optical systems summarized above.

By including at least one first reflector and at least one second reflector in a projection-optical system in a manner, as summarized above, involving consideration of the manner in which light is reflected by each of the reflectors in the system, a projection-optical system is provided with which OoB illuminance on the wafer is decreased compared to conventional systems. Also, by appropriate determination of the particular reflector(s) to be configured as a "first" reflector and of the particular reflector(s) to be configured as a "second" reflector, deterioration of optical properties of the system is reduced.

The foregoing and other objects, features, and advantages of the invention will become more apparent from the following detailed description, which proceeds with reference to the accompanying figures.

DETAILED DESCRIPTION

Embodiments of the present invention are described below with reference to the drawings.

As used herein, a reflector having a low reflectance for light of a predetermined wavelength (for example, light of a predetermined wavelength of OoB light) is called a "first reflector," and a reflector having a high reflectance for light of the predetermined wavelength is called a "second reflector."

Figure 5:
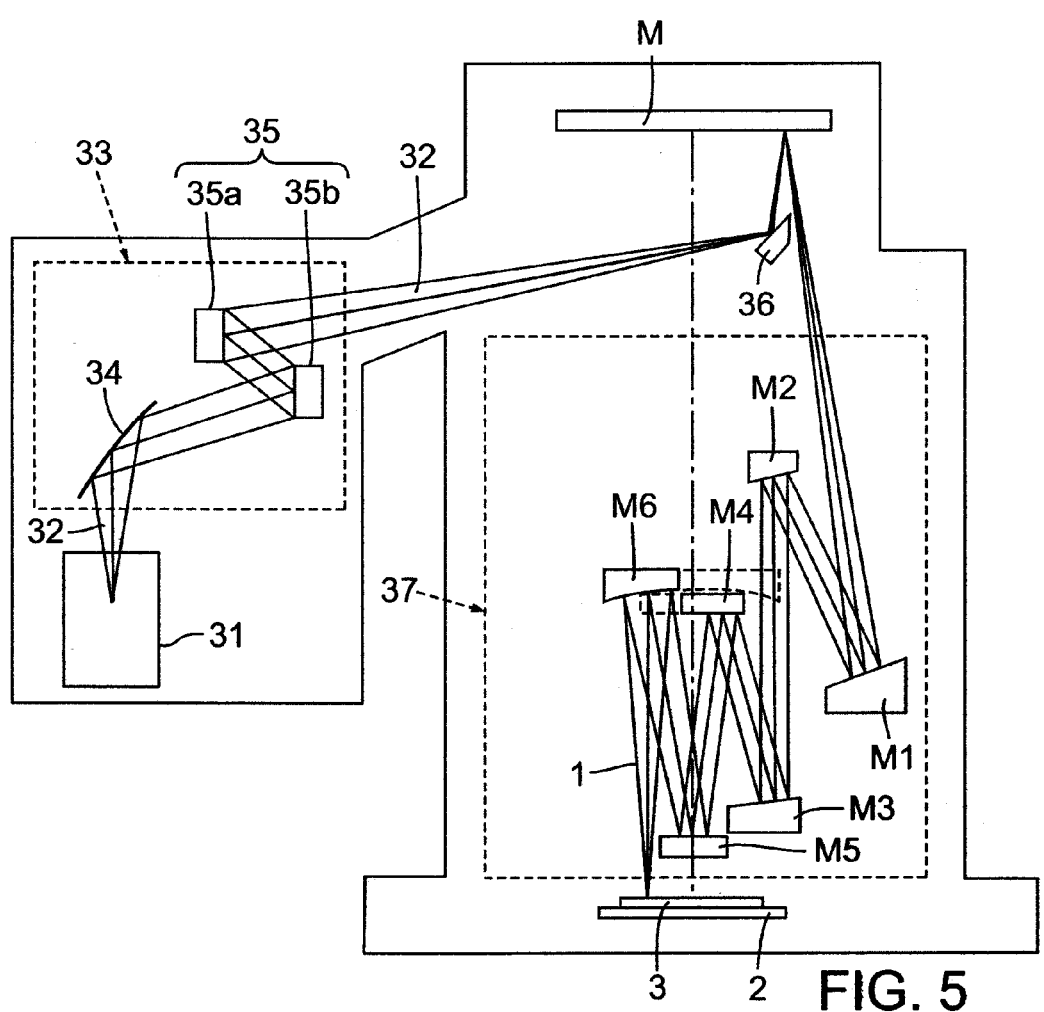
FIG. 5 is a schematic diagram of an EUV exposure apparatus comprising multilayer-film reflectors.

Reference is first made to FIG. 5 which depicts an exemplary EUV exposure apparatus that comprises multilayer-film reflectors. The apparatus includes an illumination-optical system 33 that produces a beam of illumination light 32 including exposure light (EUV light in this embodiment). The beam 32 is radiated from a light source 31 and is nearly collimated by reflection from a concave reflector 34 serving as a collimator mirror. The beam 32 enters an optical integrator 35 comprising a pair of fly-eye mirrors 35a, 35b. The reflective surface of the fly-eye mirror 35a (i.e., the vicinity of the radiating surface of the optical integrator 35) effectively forms a source of substantially planar light having a predetermined form. Light from this substantially planar light source is deflected by a planar reflector 36 and is incident on the mask M as a long, thin, arc-shaped illuminated region. An aperture plate for forming the arc-shaped illuminated region is not shown.

The projection light 1 reflected from the surface of the mask M is reflected in order by multilayer-film reflectors M1, M2, M3, M4, M5, M6 of the projection-system 37. The projection light 1 thus projects an image of the illuminated mask pattern, formed on the surface of the mask M, onto a layer of resist 3 applied to a wafer 2. Thus, the projection-optical system 37 projects an image of the pattern of a first surface (in this embodiment, the surface of the mask, termed "mask surface") onto a second surface (in this embodiment, the surface of the resist layer on the wafer, termed "wafer surface"). In the projection-optical system shown in FIG. 5, an intermediate image of the pattern is formed in the vicinity of the reflector M3, between the reflectors M3 and M4. Along the light path from the first surface to the second surface, the first-surface side is called "upstream," and the second-surface side is called "downstream."

Figure 6:
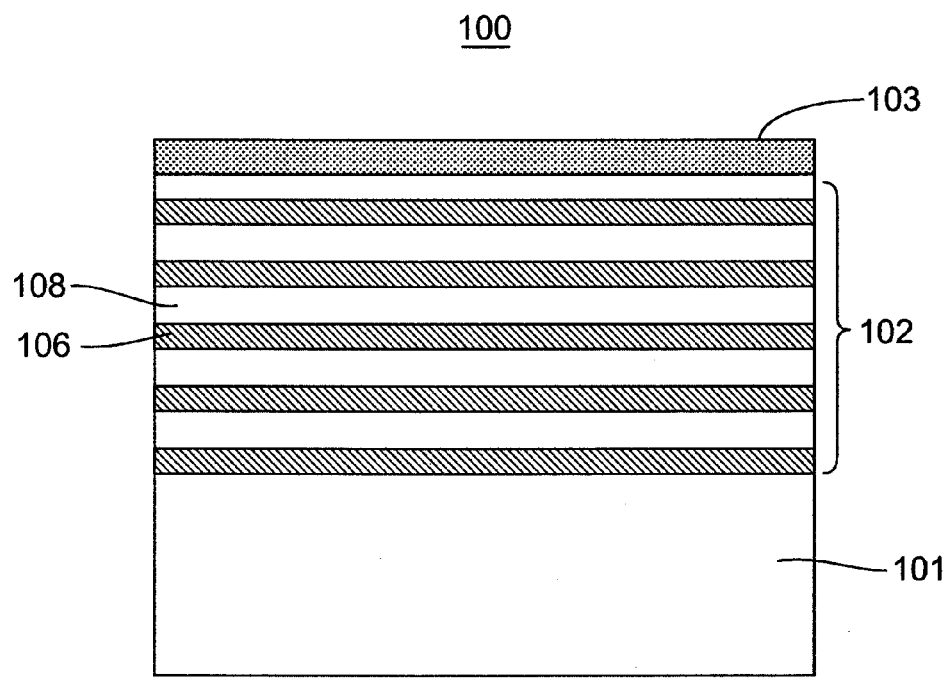
FIG. 6 shows an exemplary configuration of the first reflector.

FIG. 6 is a schematic section of an exemplary first reflector 100. A multilayer EUV light-reflecting film 102 is formed on a substrate 101 comprising quartz or low-thermal-expansion glass. An OoB light-absorbing film 103 is formed on the surface of the multilayer film 102. The multilayer film 102 comprises forty layer pairs, wherein each layer pair comprises a respective Mo layer 106 and a respective Si layer 108. The thickness of the Mo layer 106 is 2.4 nanometers, for example, and the thickness of the Si layer 108 is 4.5 nanometers, for example. The multilayer film 102 may be a laminate of any two or more of the following materials: molybdenum (Mo), silicon (Si), ruthenium (Ru), rhodium (Rh), beryllium (Be), silicon carbide (SiC), or the like.

The OoB light-absorbing film 103 is at least one layer comprising one or more of the following materials, of a mixture of any of these materials: silicon oxide (SiO), carbon (C), zirconium (Zr), silicon carbide (SiC), silicon nitride ($Si_3N_4$), boron carbide ($B_4C$), and boron nitride (BN). For example, the OoB light-absorbing film 103 comprises two such layers. Since the OoB light-absorbing film 103 absorbs mainly OoB light, the reflectance to OoB light of the first reflector having an OoB light-absorbing film 103 can be made less than a predetermined level by adjustment of the thickness of the OoB light-absorbing film 103. When the thickness of the OoB light-absorbing film 103 is less than one nanometer, the effectiveness with which the film absorbs OoB light becomes insufficient, allowing the OoB light to affect the downstream reflectors as well as the wafer. If the thickness of the OoB light-absorbing film 103 is greater than 50 nm, the film tends to absorb an excessive amount of incident EUV light. Hence, the thickness of the OoB light-absorbing film desirably is in the range of 1 to 50 nm. Regarding the first reflector 100, its reflectance to OoB light desirably is less than its reflectance to EUV light. More desirably, its reflectance to OoB light is 0 to 40%, and even more desirably is 0 to 10%.

The OoB light-absorbing film 103 can suppress oxidation of the EUV light-reflecting film 102. If further oxidation suppression is desired, an oxidation-suppressing film may be interposed between the EUV light-reflecting film 102 and the OoB light-absorbing film 103, or alternatively on the surface of the OoB light-absorbing film 103. The oxidation-suppressing film comprises at least one layer of any of the following or of an alloy thereof: ruthenium (Ru), rhodium (Rh), niobium (Nb), and platinum (Pt). For example, the oxidation-suppressing film can comprise two such layers.

Figure 7:
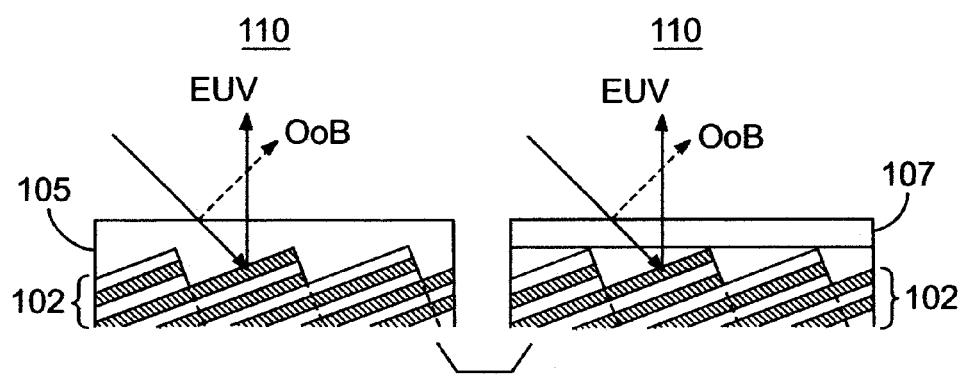
FIG. 7 shows an exemplary configuration of another type of first reflector.

As an alternative to the first reflector 100 described above, another type of reflector can be used for suppressing OoB light. The alternative reflector 110 is shown in FIG. 7, and comprises an additional layer 105 or membrane 107 on the EUV light-reflecting film 102. The layer 105 or membrane 107 comprises a material selected from silicon (Si), silicon carbide (SiC), silicon nitride ($Si_3N_4$), or the like. The thickness of the layer 105 or membrane 107 is approximately 0.05 to one micrometer, for example. The layer 105 or membrane 107 absorbs very little EUV light. The reflector 110 is configured such that the reflective surface of the EUV light-reflecting film 102 is not parallel to the reflective surface of the layer 105 or membrane 107. Rather, the EUV light-reflecting film is inclined at a predetermined angle relative to the reflective surface of the layer 105 or membrane 107.

EUV light incident to the first reflector 110 is reflected by the reflective surface of the EUV light-reflecting film 102 and arrives either at a downstream reflector or at the wafer. Meanwhile, the OoB light is reflected in a different direction from the reflection direction of the EUV light by the reflective surface of the layer 105 or membrane 107. The reflected OoB light goes out of the propagation path of the EUV light and does not reach either a downstream reflector or the wafer. The angle formed by the reflective surface of the EUV light-reflecting film 102 relative to the reflective surface of the layer 105 or membrane 107 is approximately 5 to 30 degrees, for example. The reflector 110 exhibits a low reflectance to OoB light, as seen from downstream along the propagation path of EUV light. In view of these properties, the reflector 110 is called a "first" reflector. To absorb OoB light going out of the propagation path of EUV light, a material having a high index of absorption for OoB light may be mounted in reflection direction of the OoB light. This high-index material can be a porous form of carbon black, activated charcoal, or the like.

The "first" reflectors 100 and 110 described above exhibit a slight decrease in reflectance to EUV light, compared to "second" reflectors discussed below. But, the first reflectors exhibit a greatly reduced reflectance to OoB light (for example, one-tenth or less) compared to conventional EUV reflectors.

Figure 8:
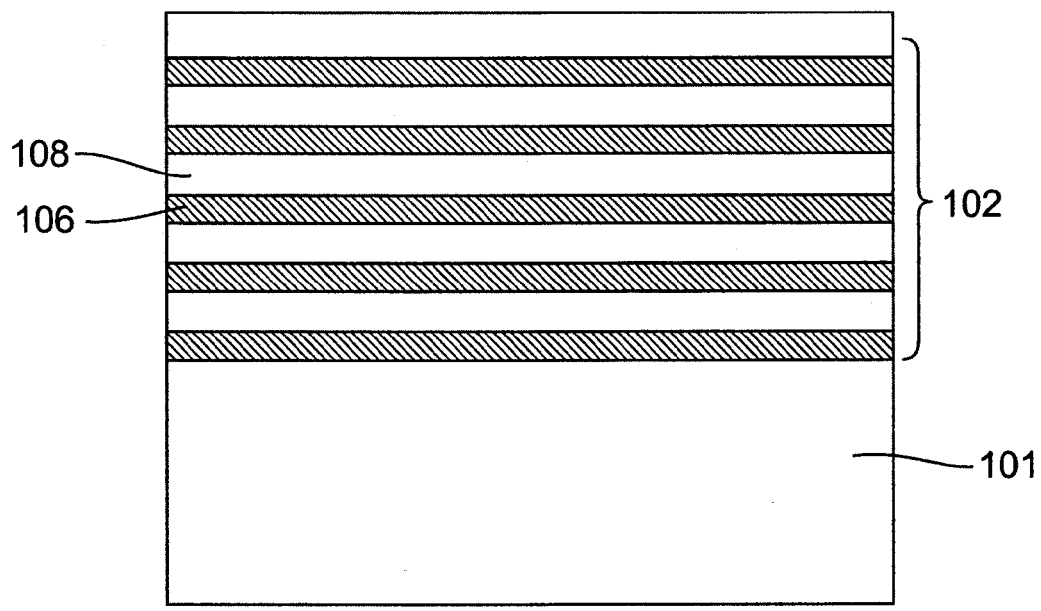
FIG. 8 shows an exemplary configuration of the second reflector.

FIG. 8 depicts an exemplary "second" reflector. The second reflector 120 comprises an EUV light-reflecting film 102 formed on a substrate 101 made of quartz or low-thermal-expansion glass. The EUV light-reflecting film 102 is a multilayer film comprising 40 layer-pairs in this example. Each layer-pair comprises a respective Mo layer 106 and a respective Si layer 108. By way of example, the thickness of the Mo layer 106 is 2.4 nanometers, and the thickness of the Si layer 108 is 4.5 nanometers. The EUV light-reflecting film 102 may be a laminate of two or more of the following materials: molybdenum (Mo), silicon (Si), ruthenium (Ru), rhodium (Rh), beryllium (Be), silicon oxide, or the like. To reduce oxidation of the EUV light-reflecting film 102, an oxidation-suppressing film may be formed on or applied to the surface of the EUV light-reflecting film 102. The oxidation-suppressing film comprises at least one layer of any of the following materials or of an alloy thereof: ruthenium (Ru), rhodium (Rh), niobium (Nb), and platinum (Pt). For example, the oxidation-suppressing film can comprise two such layers.

Figure 9:
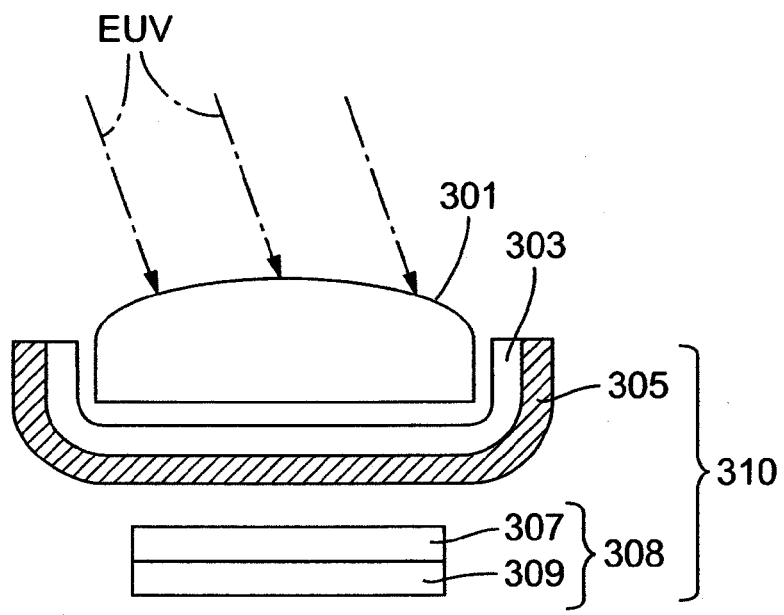
FIG. 9 shows an exemplary configuration of a reflector-cooling apparatus.

The first and second reflectors absorb light and radiant heat, causing an increase in temperature of the reflectors. As temperature increases, as discussed above, the reflectors tend to deform and contribute aberrations to the optical system. A reflector-cooling device may be installed to suppress these temperature increases in the reflectors. An example embodiment of a reflector-cooling device 310 is shown in FIG. 9. The reflector-cooling device 310 comprises a first heat-receiving plate 303 situated on the perimeter of and outside the reflective surface of a reflector 301. A cooling mechanism 305 is coupled to and established on the perimeter of the first heat-receiving plate 303. A thermal insulator 308 is situated at a defined distance from the cooling mechanism 305. The first heat-receiving plate 303 is a thin ceramic or metal plate having a high emissivity and photothermal conductivity to draw heat from the reflector 301. The cooling mechanism 305 comprises a heat pipe and cooling jacket, and absorbs heat received by the first heat-receiving plate 303. The thermal insulator 308 comprises a heating device 307 comprising a heat pipe and a second heat-receiving plate 309. The first heat-receiving plate 303 and cooling mechanism 305 prevent transmission of thermal effects to other reflectors or the like.

Embodiments of a projection-optical system comprising various combinations of first reflectors and second reflectors are described below. Tables 1-6 list data such as radiation dose, absorption dose, illuminance, absorption, and the like, of incident EUV light, of incident OoB light, and of both, for each reflector in the projection-optical system. The "effective area" is the area of the region on the reflector surface from which light is reflected. The "illuminance" is the radiation dose divided by the effective area. The "absorption" is the absorption dose divided by the effective area. With first reflectors, the reflectance for EUV light is 60%, and the reflectance for OoB light is 10%. With second reflectors, the reflectance for EUV light is 65% and the reflectance for OoB light is 80%. In the following tables, reflectors (from among reflectors M1-M6) used as "first" reflectors are denoted with an asterisk: Mi* (wherein i=1 to 6).

Table 1 lists data such as the radiation dose, absorption dose, illuminance, absorption, and the like, of EUV light, of OoB light, and of both lights, for each reflector in a projection-optical system in which all of the reflectors M1-M6 (FIG. 5) are used as "second" reflectors. In Table 1, the OoB radiation dose on the wafer is 105 mW.

higher than when using a second reflector to produce the same EUV-light illuminance on the wafer that otherwise would be obtained when a second reflector is used. Therefore, in a system in which all the reflectors M1-M6 are first reflectors, the dose of EUV light absorbed by each reflector in the system is increased. Actually, comparing the data in Table 2 with the data in Table 1, the OoB light-absorption dose of the reflector M3 is decreased from 51 mW to 5.9 mW, but the EUV light-absorption dose is increased from 192 mW to 302 mW. Thus, as a result of OoB light absorption in the upstream first reflectors, the total absorbed dose by the system is increased in some instances due to the increase in EUV light absorption, even if the OoB light-absorption dose in a first reflector is decreased relative to the OoB dose in a second reflector.

When all the reflectors M1-M6 are first reflectors, the total absorption dose of a specific reflector (reflector M3 for example) is increased, deformation due to absorbed heat is greater than in a system in which all the reflectors M1-M6 are

TABLE 1

| Parameter | M1 | M2 | M3 | M4 | M5 | M6 | On wafer |
|---|---|---|---|---|---|---|---|
| Effective area [cm$^2$] | 130 | 100 | 30 | 60 | 36 | 430 | |
| EUV radiation dose [mW] | 1,300 | 845 | 549 | 357 | 232 | 151 | 98 |
| EUV absorption dose [mW] | 455 | 296 | 192 | 125 | 81 | 53 | |
| EUV illuminance [mW/cm$^2$] | 10.0 | 8.5 | 18.3 | 6.0 | 6.4 | 0.4 | |
| EUV absorption [mW/cm$^2$] | 3.5 | 3.0 | 6.4 | 2.1 | 2.3 | 0.1 | |
| OoB radiation dose [mW] | 400 | 320 | 256 | 205 | 164 | 131 | 105 |
| OoB absorption dose [mW] | 80 | 64 | 51 | 41 | 33 | 26 | |
| OoB illuminance [mW/cm$^2$] | 3.1 | 3.2 | 8.5 | 3.4 | 4.6 | 0.3 | |
| OoB absorption [mW/cm$^2$] | 0.6 | 0.6 | 1.7 | 0.7 | 0.9 | 0.1 | |
| Total illuminance [mW/cm$^2$] | 13.1 | 11.7 | 26.8 | 9.4 | 11.0 | 0.7 | |
| Total absorption [mW/cm$^2$] | 4.1 | 3.6 | 8.1 | 2.8 | 3.2 | 0.2 | |

Table 2 lists data such as the radiation dose, absorption dose, illuminance, absorption, and the like, of EUV light, of OoB light, and of both lights, for each reflector, in a projection-optical system in which all of the reflectors M1-M6 are used as "first" reflectors. In Table 2, the OoB radiation dose on the wafer is 0.001 mW. This value is 0.00095% of the corresponding value of 105 mW shown in Table 1. Thus, with the Table-2 configuration, the OoB radiation dose on the wafer is greatly reduced as a result of all the reflectors M1-M6 being first reflectors.

second reflectors, and system aberration is increased. As discussed below, a reflector such as M3 cannot accommodate aberration caused by thermal deformation. Therefore, the optical properties of the projection-optical system in which all the reflectors M1-M6 are first reflectors deteriorate greatly compared to systems comprising all second reflectors. When all the reflectors M1-M6 are first reflectors, the OoB radiation dose on the wafer is greatly decreased, but the optical properties of the projection-system are substantially degraded compared to a system comprising all second reflectors.

TABLE 2

| Parameter | M1* | M2* | M3* | M4* | M5* | M6* | On wafer |
|---|---|---|---|---|---|---|---|
| Effective area [cm$^2$] | 130 | 100 | 30 | 60 | 36 | 430 | |
| EUV radiation dose [mW] | 2,100 | 1,260 | 756 | 454 | 272 | 163 | 98 |
| EUV absorption dose [mW] | 840 | 504 | 302 | 181 | 109 | 65 | |
| EUV illuminance [mW/cm$^2$] | 16.2 | 12.6 | 25.2 | 7.6 | 7.6 | 0.4 | |
| EUV absorption [mW/cm$^2$] | 6.5 | 5.0 | 10.1 | 3.0 | 3.0 | 0.2 | |
| OoB radiation dose [mW] | 660 | 66 | 6.6 | 0.7 | 0.07 | 0.01 | 0.001 |
| OoB absorption dose [mW] | 594 | 59 | 5.9 | 0.6 | 0.06 | 0.01 | |
| OoB illuminance [mW/cm$^2$] | 5.1 | 0.7 | 0.2 | 0.0 | 0.0 | 0.0 | |
| OoB absorption [mW/cm$^2$] | 4.6 | 0.6 | 0.2 | 0.0 | 0.0 | 0.0 | |
| Total illuminance [mW/cm$^2$] | 21.2 | 13.3 | 25.4 | 7.6 | 7.6 | 0.4 | |
| Total absorption [mW/cm$^2$] | 11.0 | 5.6 | 10.3 | 3.0 | 3.0 | 0.2 | |

Figure 2:
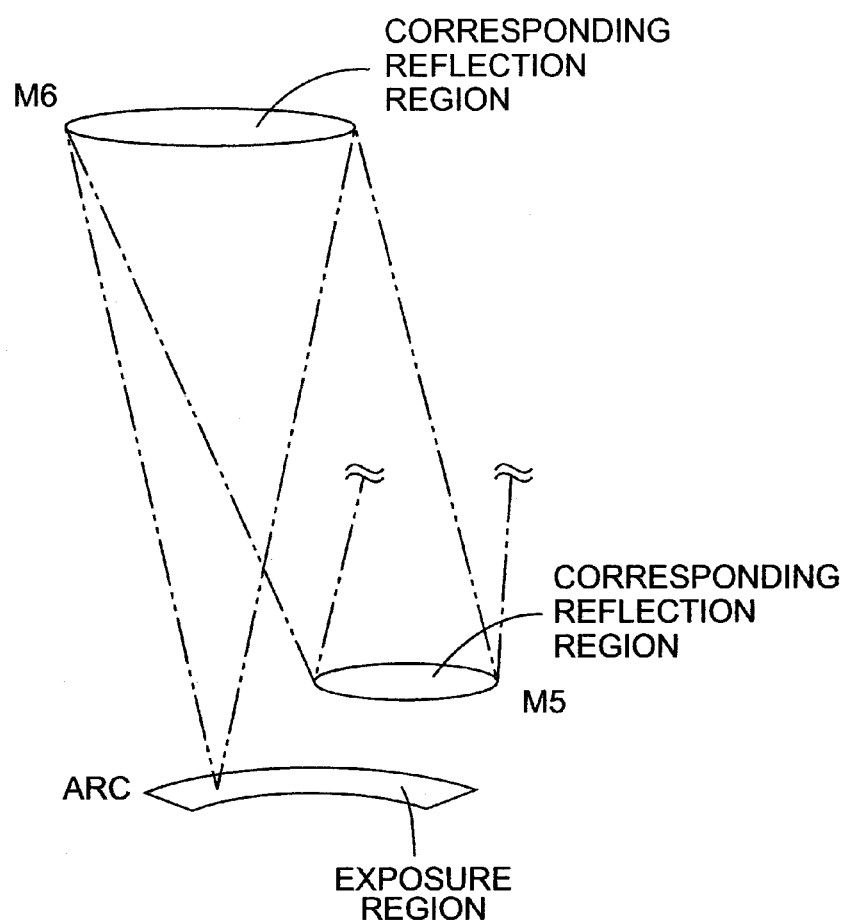
FIG. 2 shows a light beam, reflected by reflectors M5 and M6, being collected at a predetermined point on the wafer surface.

In Table 2, for example, the total absorption by the reflector M3 is 10.3 mW/cm$^2$, which is greater than the corresponding dose of 8.1 mW/cm$^2$ in Table 1. The reason for this difference is as follows. First reflectors not only absorb OoB light better than second reflectors, but also absorb more EUV light than second reflectors. Consequently, when a first reflector is used, the intensity of EUV light entering the reflector M1 must be The manner in which light is reflected from each reflector in the projection-optical system is as follows. FIG. 2 shows the typical situation in which a light beam reflected by reflectors M5 and M6 converges at a predetermined point on the wafer surface. Thus, it will be understood that a light beam collected at one point in the exposure region on the wafer does not reach the wafer surface from only one direction. Rather, the beam converges on the wafer from three-dimensional space having a point spread, and is reflected by regions on the reflectors M5, M6 having finite areas. The region on an upstream reflector at which a light beam, collected at one point of the exposure region on the wafer surface, is reflected is called the "corresponding reflection region." The respective corresponding reflection region on each such reflector forms an approximate circle on the reflecting surface of the reflector. Also, for each of two different convergence points in the exposure region, the corresponding reflection regions of the upstream reflector partially overlap. The overlap region is called the "common reflecting region."

Figure 3A:
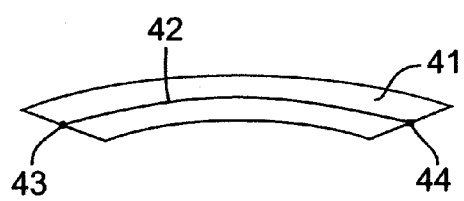
FIG. 3 shows a relationship between the exposure region on the wafer surface and the corresponding reflecting region and common reflecting region on the reflector.
Figure 3B:
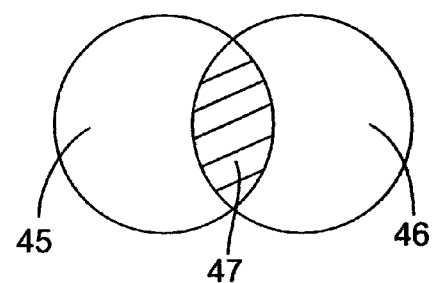

The relationship between the corresponding reflection region and the common reflecting region is illustrated in FIGS. 3(A)-3(B), which show the typical relationship between the exposure region on the wafer surface (FIG. 3(A)) and the corresponding reflecting region and common reflecting region on the reflector (FIG. 3(B)). In FIG. 3(A), the projection-optical system defines an arc-shaped exposure region 41 of predetermined width. A first point 43 is one end of an arc 42 passing through the widthwise center of the arc-shaped exposure region 41, and the second point 44 is the other end of the arc. In FIG. 3(B), the region from which the light beam collected at the first point 43 is reflected on the upstream reflector is the denoted as corresponding reflection region 45, and the region from which the light beam collected at the second point 44 is reflected on the upstream reflector is denoted as corresponding reflection region 46. The region 47 in which the regions 45 and 46 overlap is the common reflecting region for the two points 43, 44. In the foregoing discussion, the relationship between the corresponding reflecting regions and the common reflecting region is described for the two points 43, 44 at respective ends of the arc 42. However, any two points in the exposure region can be considered in the same way. Also, on the upstream reflector, the corresponding reflection region corresponding to the entire arc 42 takes a form in which the circles of the corresponding reflection regions continuously shift and overlap.

Figure 1:
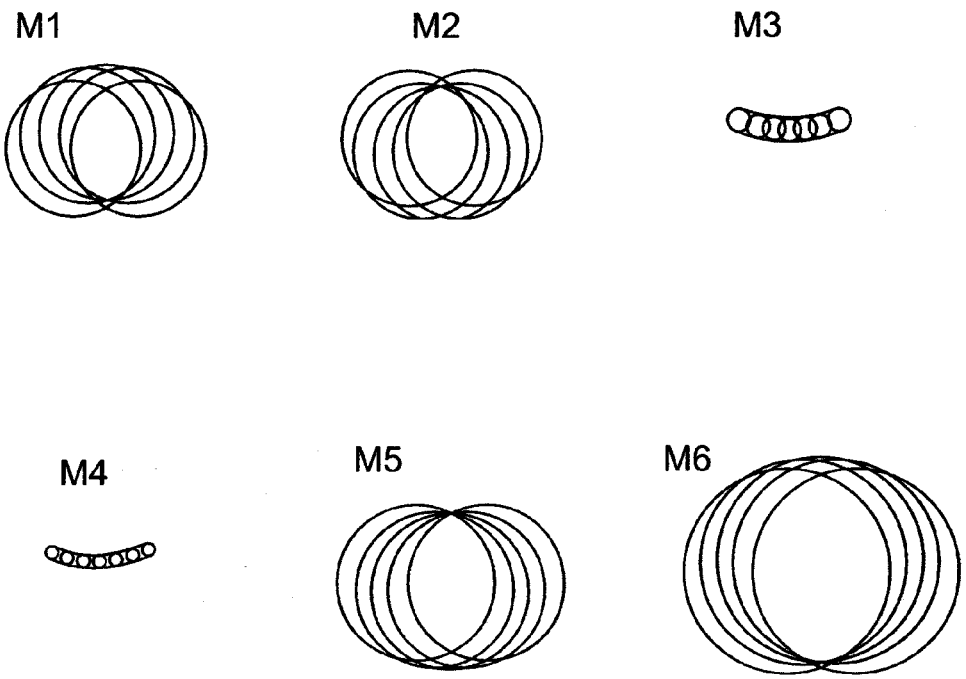
FIG. 1 shows exemplary regions at which light is reflected on each reflector M1, M2, M3, M4, M5, M6 of a projection-optical system.

FIG. 1 shows exemplary forms of the region in which light is reflected from the surface of each reflector M1, M2, M3, M4, M5, M6 in the projection-optical system of FIG. 5, for example. When the projection-optical system defines an arc-shaped exposure region of predetermined width, the region from which light is reflected on each reflector surface takes a form in which a circle continuously shifts and overlaps as shown. In FIG. 1 the reflectors are divided into one group (reflectors M1, M2, M5, M6) in which the common reflecting regions occupy a relatively high percentage of the corresponding reflection regions (high common-region percentage) and another group (reflectors M3, M4) in which the common reflecting regions occupy a relatively low percentage of the corresponding reflection regions (low common-region percentage). A small number of these relationships of common reflecting region relative to corresponding reflecting regions include instances in which the corresponding reflection regions on the upstream reflector corresponding to two points at opposite ends of the arc-shaped exposure region do not overlap; in these instances the common-region percentage is zero. With respect to reflectors in which the common-region percentage is low, the common-region percentage pertaining to two points at opposite ends of the arc-shaped exposure region is desirably less than 40%, more desirably 0 to 20%, and still more desirably 0 to 10%.

Figure 4:
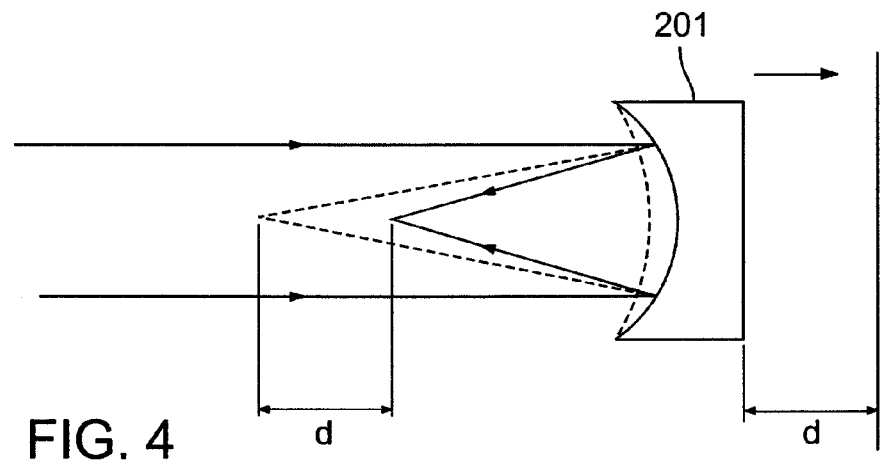
FIG. 4 shows a method for adjusting the reflectors.

Radiant-heat deformation of reflectors in which the common-region percentage is high (e.g., greater than 40%) is of a comparatively low order (i.e., low spatial frequency), such as a change in the radius of curvature of the entire reflector. This deformation can be accommodated by adjusting the position, or the like, of the reflectors. FIG. 4 depicts a typical method for making the adjustment. When a reflector 201 is deformed as denoted by the dotted line, the position of its focal point moves to the left (in the figure) by a distance d. To correct the focal point, the reflector 201 is moved to the right a distance d. Thus, with a reflector having a high common-region percentage, it is possible to accommodate radiant-heat deformation manifest as a change in the radius of curvature of the reflector as a whole. The movement distance is appropriately varied according to the magnifying power of the reflector and the amount of deformation being exhibited by the reflector.

Radiant-heat deformation of reflectors in which the common-region percentage is low (e.g., less than 40%) is relatively high-order (i.e., a high spatial frequency), such as a localized deformation of the reflector surface. This type of deformation cannot be accommodated or corrected by adjusting the position of the reflector, or the like.

In FIG. 1, for each reflector M1-M6, the different depicted reflecting regions correspond to the position of respective points in the exposure region on the wafer. On a reflector having a high common-region percentage, the corresponding reflection regions for the two points at opposite ends of the arc-shaped exposure region overlap. On a reflector having a low common-region percentage, the corresponding reflection regions do not overlap. For example, consider the respective corresponding reflection regions for the points 43, 44 on the arc 42 in exposure region 41 in FIG. 3. The respective percentages of the common reflecting regions are as follows: 46% for M1, 47% for M2, 0% for M3, 0% for M4, 55% for M5, and 80% for M6. Thus, with a reflector having a high common-region percentage, radiant-heat deformation causes approximately the same type of deformation at any location in the exposure region. In contrast, with a reflector having a low common-region percentage, radiant-heat deformation causes very different aberrations at various locations in the exposure region. Hence, since it is difficult to accommodate radiant-heat deformation of a reflector having a low common-region percentage, it is desirable to make this deformation as small as possible.

In view of the above, in a projection-optical system according to a first embodiment, the reflector located closest to the mask surface has a high common-region percentage that can readily accommodate reflector deformations caused by radiant heat. The next reflector in the system has a low common-region percentage and does not easily accommodate radiant-heat deformation. (By "closest" is meant nearest along a light-propagation path from the mask surface to the wafer surface.) This configuration allows OoB light to be readily absorbed by the first reflector the mask-surface side.

For example, among the reflectors having high common-region percentages and that can accommodate radiant-heat deformations, the reflector M1 located closest (along the light-propagation path) to the mask surface serves as a first reflector and absorbs OoB light. The reflectors M3, M4 having low respective common-region percentages (and that do not easily accommodate radiant-heat deformations) and the reflectors M2, M5, M6 having high common-region percentages serve as second reflectors.

The most upstream reflector M1 normally has a high common-region percentage. Hence, "the most upstream reflector among the reflectors having high common-region percentages" is the reflector that located the most upstream (along the light-propagation path) in the projection-optical system. The most upstream reflector M1 as a first reflector absorbs sufficient OoB light.

Table 3 lists data such as the radiation dose, absorption dose, illuminance, and the like, of EUV light, OoB light, and a total of both lights, for each reflector in a system in which the reflector M1 located closest to the mask surface and most upstream serves as a first reflector. The reflectors M3, M4, having low common-region percentages, and the reflectors M2, M5, M6 having high common-region percentages, serve as second reflectors. The OoB radiation dose on the wafer is 14.4 mW. This value is 13.7% of the 105 mW dose noted in Table 1 (in which all the reflectors M1-M6 are second reflectors), which represents a substantial reduction in the OoB dose. The total absorption by the reflector M3 is 6.7 mW/cm$^2$, which is less than the 8.1 mW/cm$^2$ noted for this reflector in Table 1. The total absorption by the reflector M4 is 2.2 mW/cm$^2$, which is less than the 2.8 mW/cm$^2$ noted for this reflector in Table 1. Consequently, in the present embodiment, it is possible to reduce deformation, due to radiant heat, of the reflectors having low common-region percentages.

further reduced by increasing the number of first reflectors, relative to the first embodiment.

Table 4 lists data such as radiation dose, absorption dose, illuminance, and the like, of EUV light, OoB light, and of both lights, for each reflector of the system. Again, the most upstream reflectors M1, M2 (having high respective common-region percentages) serve as first reflectors, and the remaining reflectors M3-M6 serve as second reflectors. The reflectors M3, M4 have low respective common-region percentages, and the reflectors M5, M6 have high respective common-region percentages. The reflectors M5, M6 are the most downstream of the reflectors. The OoB radiation dose on

TABLE 3

| Parameter | M1* | M2 | M3 | M4 | M5 | M6 | On wafer |
|---|---|---|---|---|---|---|---|
| Effective area [cm$^2$] | 130 | 100 | 30 | 60 | 36 | 430 | |
| EUV radiation dose [mW] | 1,410 | 846 | 550 | 357 | 232 | 151 | 98 |
| EUV absorption dose [mW] | 564 | 296 | 192 | 125 | 81 | 53 | |
| EUV illuminance [mW/cm$^2$] | 10.8 | 8.5 | 18.3 | 6.0 | 6.5 | 0.4 | |
| EUV absorption [mW/cm$^2$] | 4.3 | 3.0 | 6.4 | 2.1 | 2.3 | 0.1 | |
| OoB radiation dose [mW] | 440 | 44 | 35.2 | 28.2 | 22.5 | 18.0 | 14.4 |
| OoB absorption dose [mW] | 396 | 9 | 7.0 | 5.6 | 4.5 | 3.6 | |
| OoB illuminance [mW/cm$^2$] | 3.4 | 0.4 | 1.2 | 0.5 | 0.6 | 0.0 | |
| OoB absorption [mW/cm$^2$] | 3.0 | 0.1 | 0.2 | 0.1 | 0.1 | 0.0 | |
| Total illuminance [mW/cm$^2$] | 14.2 | 8.9 | 19.5 | 6.4 | 7.1 | 0.4 | |
| Total absorption [mW/cm$^2$] | 7.4 | 3.0 | 6.7 | 2.2 | 2.4 | 0.1 | |

In a projection-optical system according to a second embodiment, the reflectors M1, M2 have high respective common-region percentages and can accommodate deformations due to radiant heat. The reflectors M1, M2 are the most upstream reflectors (i.e., closest, along the light-propagation path from the mask surface to the wafer surface). The next reflector M3 has a low common-region percentage. The reflectors M1, M2 absorb OoB light in the manner of first reflectors. The reflectors M3, M4 have low respective common-region percentages and do not easily accommodate radiant-heat deformations. The reflectors M5, M6 have high respective common-region percentages and are located closer (along the light-propagation path) to the wafer surface than the reflector M3. The reflectors M3-M6 serve as second reflectors. The upstream reflectors M1, M2, serving as first reflectors, sufficiently absorb OoB light, which allows the downstream reflectors M5, M6 (having high respective common-region percentages) to serve as second reflectors. In this embodiment, the OoB radiation dosage on the wafer can be the wafer is 2.0 mW, which is 1.9% of the 105 mW value noted in Table 1 (in which all the reflectors M1-M6 are second reflectors). This data in Table 4 represents a substantial reduction. The total absorption by the reflector M3 is 6.5 mW/cm$^2$, which is less than the 8.1 mW/cm$^2$ noted for this reflector in Table 1. The total absorption by the reflector M4 is 2.1 mW/cm$^2$ in Table 4, which is less than the 2.8 mW/cm$^2$ noted for this reflector in Table 1. These data show that it is possible to reduce deformation caused by absorption of radiant heat by reflectors having low respective common-region percentages.

TABLE 4

| Parameter | M1* | M2* | M3 | M4 | M5 | M6 | On wafer |
|---|---|---|---|---|---|---|---|
| Effective area [cm$^2$] | 130 | 100 | 30 | 60 | 36 | 430 | |
| EUV radiation dose [mW] | 1,530 | 918 | 551 | 358 | 233 | 151 | 98 |
| EUV absorption dose [mW] | 612 | 367 | 193 | 125 | 81 | 53 | |
| EUV illuminance [mW/cm$^2$] | 11.8 | 9.2 | 18.4 | 6.0 | 6.5 | 0.4 | |
| EUV absorption [mW/cm$^2$] | 4.7 | 3.7 | 6.4 | 2.1 | 2.3 | 0.1 | |
| OoB radiation dose [mW] | 480 | 48 | 4.8 | 3.8 | 3.1 | 2.5 | 2.0 |
| OoB absorption dose [mW] | 432 | 43 | 1.0 | 0.8 | 0.6 | 0.5 | |
| OoB illuminance [mW/cm$^2$] | 3.7 | 0.5 | 0.2 | 0.1 | 0.1 | 0.0 | |
| OoB absorption [mW/cm$^2$] | 3.3 | 0.4 | 0.0 | 0.0 | 0.0 | 0.0 | |
| Total illuminance [mW/cm$^2$] | 15.5 | 9.7 | 18.5 | 6.0 | 6.5 | 0.4 | |
| Total absorption [mW/cm$^2$] | 8.0 | 4.1 | 6.5 | 2.1 | 2.3 | 0.1 | |

In a projection-optical system according to a third embodiment of the present invention, the reflector M3 (that has the highest total illuminance in a system in which all the reflectors are second reflectors) is a second reflector. The other reflectors M1-M2, M4-M6 are first reflectors. When all the reflectors in the system are second reflectors, the reflector having the highest total illuminance is a reflector having a comparatively small effective reflecting region. In this embodiment, in contrast, the reflector M3 having the highest total illuminance is also the reflector receiving the highest total absorption dose (absorption) per unit area. Thus, the reflector M3, which would be easily deformed by absorbed heat, is a second reflector. Since the other reflectors M1-M2 and M4-M6 are first reflectors, the OoB radiation dosage on the wafer can be reduced compared to the first and second embodiments.

As previously discussed, in the projection-optical system shown in FIG. 5, an intermediate image is formed in the vicinity of the reflector M3, between the reflectors M3 and M4. Consequently, the reflector M3 is also in the vicinity of the intermediate image. This is another reason the illuminance of this reflector is high, because the light beam converges in the vicinity of the location of the intermediate image.

Table 5 lists data such as radiation dose, absorption dose, illuminance, and the like, of EUV light, OoB light, as well as both lights, for each reflector of a system in which the reflector M3 (that would have the highest total illuminance in a system in which all the reflectors are second reflectors), is a second reflector while the other reflectors M1-M2, M4-M6 are first reflectors. The OoB radiation dose on the wafer is 0.005 mW, which is 0.0048% of the 105 mW dose noted in Table 1 (pertaining to a system in which all the reflectors M1-M6 are second reflectors). Thus, in this embodiment, the OoB dose on the wafer is substantially reduced. Also, the total absorption by the reflector M3 (having a low common-region percentage) is 8.1 mW/cm$^2$, which is equal to the 8.1 mW/cm$^2$ noted in Table 1. The total absorption by the reflector M4 (having a low common region percentage) is 3.1 mW/cm$^2$, which is slightly greater than the 2.8 mW/cm$^2$ noted in Table 1. Consequently, with this embodiment, it is possible to reduce deformation of reflectors (having low common-region percentages) due to radiant heat absorption to approximately the same level as exhibited by the system of Table 1.

According to a fourth embodiment of the present invention, the reflectors M1, M2, M5, M6 (having high respective common-region percentages that can accommodate deformations caused by absorption of radiant heat) absorb OoB light as first reflectors. The remaining reflectors M3, M4 (having low respective common-region percentages that do not easily accommodate deformations caused by absorption of radiant heat) are second reflectors that absorb comparatively small amounts of light. Since the reflectors M3, M4 are second reflectors in this embodiment, radiant-heat deformation of reflectors having low respective common-region percentages is reduced.

Table 6 lists data such as radiation dose, absorption dose, illuminance, and the like, of EUV light, OoB light, as well as both lights, by each reflector of a system in which the reflectors M1, M2, M5, M6 (having high common-region percentages) are first reflectors, and the reflectors M3, M4 (having low common-region percentages) are second reflectors. The OoB radiation dose on the wafer is 0.04 mW, which is 0.038% of the 105 mW dose noted in Table 1 (in which all the reflectors M1-M6 of the system were second reflectors). Thus, this embodiment exhibits a substantial reduction of OoB dose on the wafer. Also, the total absorption by the reflector M3 (having a low common-region percentage) is 7.6 mW/cm$^2$, which is less than the 8.1 mW/cm$^2$ noted in Table 1. The total absorption by the reflector M4 (also having a low common-region percentage) is 2.5 mW/cm$^2$, which is lower than the 2.8 mW/cm$^2$ noted in Table 1. These data indicate the reduction of reflector deformation due to absorption of radiant heat by reflectors having low common-region percentages.

TABLE 5

| Parameter | M1* | M2* | M3 | M4* | M5* | M6* | On wafer |
|---|---|---|---|---|---|---|---|
| Effective area [cm$^2$] | 130 | 100 | 30 | 60 | 36 | 430 | |
| EUV radiation dose [mW] | 1,930 | 1,158 | 695 | 452 | 271 | 163 | 98 |
| EUV absorption dose [mW] | 772 | 463 | 243 | 181 | 108 | 65 | |
| EUV illuminance [mW/cm$^2$] | 14.8 | 11.6 | 23.2 | 7.5 | 7.5 | 0.4 | |
| EUV absorption [mW/cm$^2$] | 5.9 | 4.6 | 8.1 | 3.0 | 3.0 | 0.2 | |
| OoB radiation dose [mW] | 610 | 61 | 6.1 | 4.9 | 0.49 | 0.05 | 0.005 |
| OoB absorption dose [mW] | 549 | 55 | 1.2 | 4.4 | 0.44 | 0.04 | |
| OoB illuminance [mW/cm$^2$] | 4.7 | 0.6 | 0.2 | 0.1 | 0.0 | 0.0 | |
| OoB absorption [mW/cm$^2$] | 4.2 | 0.5 | 0.0 | 0.1 | 0.0 | 0.0 | |
| Total illuminance [mW/cm$^2$] | 19.5 | 12.2 | 23.4 | 7.6 | 7.5 | 0.4 | |
| Total absorption [mW/cm$^2$] | 10.2 | 5.2 | 8.1 | 3.1 | 3.0 | 0.2 | |

TABLE 6

| Parameter | M1* | M2* | M3 | M4 | M5* | M6* | On wafer |
|---|---|---|---|---|---|---|---|
| Effective area [cm$^2$] | 130 | 100 | 30 | 60 | 36 | 430 | |
| EUV radiation dose [mW] | 1,790 | 1,074 | 644 | 419 | 272 | 163 | 98 |
| EUV absorption dose [mW] | 716 | 430 | 226 | 147 | 109 | 65 | |
| EUV illuminance [mW/cm$^2$] | 13.8 | 10.7 | 21.5 | 7.0 | 7.6 | 0.4 | |
| EUV absorption [mW/cm$^2$] | 5.5 | 4.3 | 7.5 | 2.4 | 3.0 | 0.2 | |
| OoB radiation dose [mW] | 560 | 56 | 5.6 | 4.5 | 3.6 | 0.36 | 0.04 |
| OoB absorption dose [mW] | 504 | 50 | 1.1 | 0.9 | 3.2 | 0.32 | |
| OoB illuminance [mW/cm$^2$] | 4.3 | 0.6 | 0.2 | 0.1 | 0.1 | 0.0 | |
| OoB absorption [mW/cm$^2$] | 3.9 | 0.5 | 0.0 | 0.0 | 0.1 | 0.0 | |
| Total illuminance [mW/cm$^2$] | 18.1 | 11.3 | 21.7 | 7.1 | 7.7 | 0.4 | |
| Total absorption [mW/cm$^2$] | 9.4 | 4.8 | 7.6 | 2.5 | 3.1 | 0.2 | |

Thus, with the present invention, the OoB radiation dosage on a wafer can be reduced. Also reduced is any deterioration of optical properties of projection-optical systems caused by deformation of constituent reflectors (having low common-region percentages) due to absorption of radiant heat. Projection-optical systems providing these advantages comprise both first and second deflectors, as defined herein, and are useful in, for example, lithography systems.

An exposure system according to the invention comprises a projection-optical system comprising first reflectors and second reflectors as discussed above. Used with such an exposure system is a reflective mask M (also termed a "reticle") that defines the pattern to be exposed onto the wafer. In some embodiments, the mask can comprise a patterned absorbing layer disposed on the uppermost layer of the first reflector (as defined above). When such a mask is used, any OoB light entering the projection-optical system 37 (FIG. 5) is reduced more than in systems using a conventional reflective mask. This reduction of OoB light reduces thermal aberrations of the projection-optical system and suppresses flare caused by OoB light, which yields improved resolving power of the system. In other embodiments the first reflector (as defined above) can be used in an illumination-optical system.

Also, although the embodiments described above are set forth in the context of projection-optical systems as used in exposure systems utilizing EUV light as exposure light, the principles of the invention alternatively can be applied to projection-optical systems and other optical systems of exposure apparatus using light of other wavelengths, rather than EUV light, as exposure light.

Figure 10:
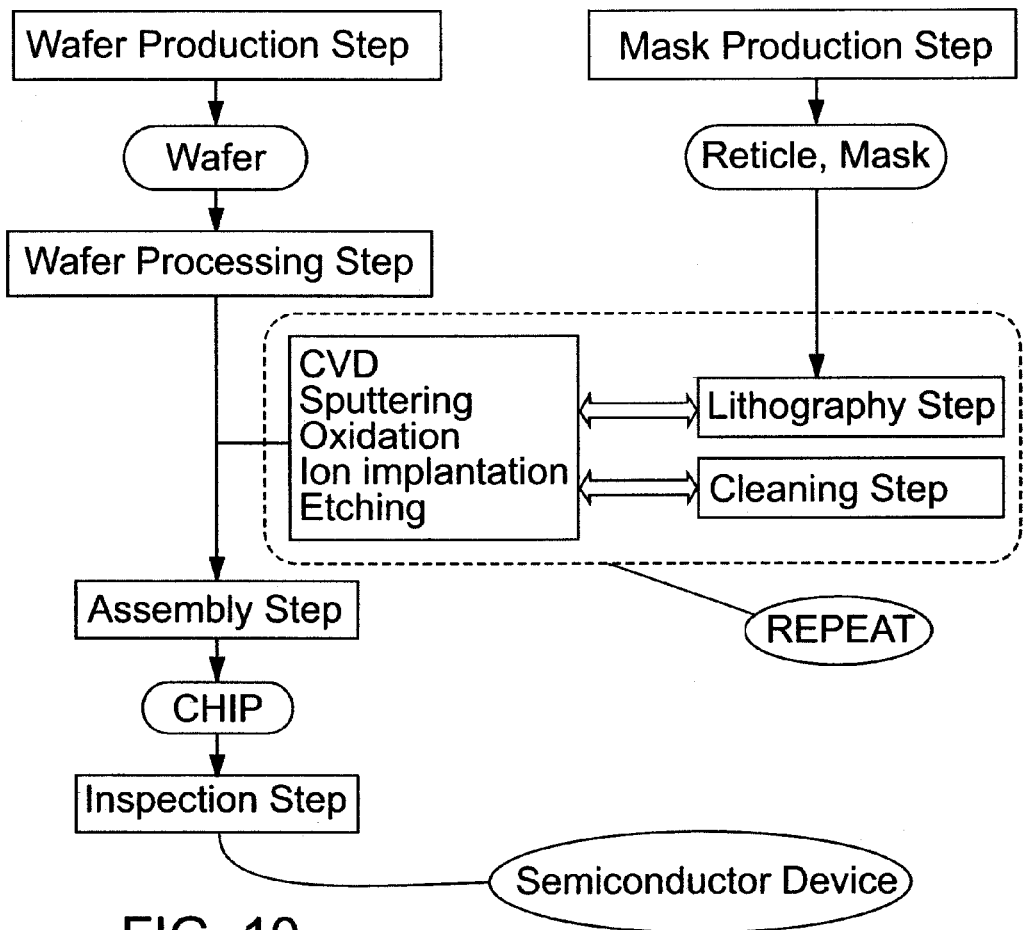
FIG. 10 is a process-flow diagram of a method for manufacturing a semiconductor device, the method including a lithography process performed using a lithography system as disclosed herein.

FIG. 10 is a flowchart of an exemplary microelectronic-fabrication method in which systems and methods according to the invention can be applied readily. The fabrication method generally comprises the main steps of wafer production (wafer manufacturing or preparation), reticle (mask) production or preparation; wafer processing, device (chip) assembly (including dicing of chips and rendering the chips operational), and device (chip) inspection. Each step usually comprises several sub-steps.

Among the main steps, wafer processing is key to achieving the smallest feature sizes (critical dimensions) and best inter-layer registration. In the wafer-processing step, multiple circuit patterns are layered successively atop one another on the wafer, forming multiple chips destined to be memory chips or main processing units (MPUs), for example. The formation of each layer typically involves multiple sub-steps. Usually, many operative microelectronic devices are produced on each wafer.

Typical wafer-processing steps include: (1) thin-film formation (by, e.g., sputtering or CVD) involving formation of a dielectric layer for electrical insulation or a metal layer for connecting wires or electrodes; (2) oxidation step to oxidize the substrate or the thin-film layer previously formed; (3) microlithography to form a resist pattern for selective processing of the thin film or the substrate itself; (4) etching or analogous step (e.g., dry-etching) to etch the thin film or substrate according to the resist pattern; (5) doping as required to implant ions or impurities into the thin film or substrate according to the resist pattern; (6) resist stripping to remove the remaining resist from the wafer; and (7) wafer inspection. Wafer processing is repeated as required (typically many times) to fabricate the desired microelectronic devices on the wafer.

Figure 11:
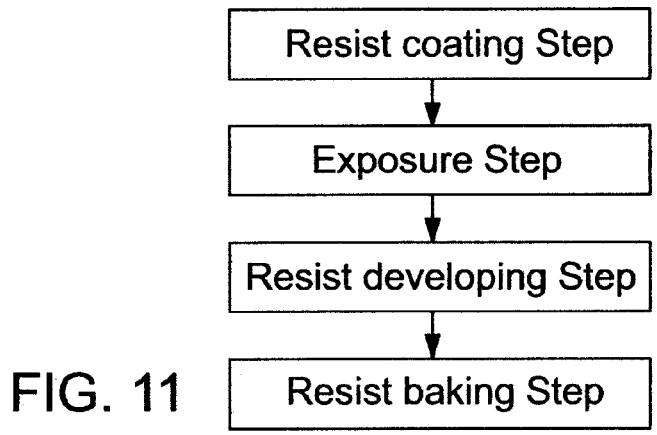
FIG. 11 is a process-flow diagram of an exemplary lithography process used in the method of FIG. 10.

FIG. 11 provides a flowchart of typical steps performed in microlithography, which is a principal step in the wafer-processing step shown in FIG. 10. The microlithography step typically includes: (1) resist-application step, wherein a suitable resist is coated on the wafer substrate (which an include a circuit element formed in a previous wafer-processing step); (2) exposure step, to expose the resist with the desired pattern by microlithography; (3) development step, to develop the exposed resist to produce the imprinted image; and (4) optional resist-baking step, to enhance the durability of and stabilize the resist pattern.

The process steps summarized above are all well known and are not described further herein.

What is claimed is:

1. A projection-optical system for projecting an image of a pattern from a first surface onto a second surface, the system comprising:
    a first reflector and a second reflector situated along a light-propagation path extending from the first surface to the second surface, wherein
    the first reflector has a reflectance, for light of a predetermined wavelength, that is less than a predetermined reflectance;
    the second reflector has a reflectance, for light of the predetermined wavelength, that is greater than the predetermined reflectance; and
    along the light-propagation path the first reflector is situated closer than the second reflector to the first surface.

2. The system of claim 1, further comprising at least one additional reflector, wherein, along the light-propagation path, the first reflector is closest to the first surface.

3. The system of claim 1, wherein the reflectance of the first reflector to light of the predetermined wavelength is less than half the reflectance of the second reflector to light of the predetermined wavelength.

4. The system of claim 1, wherein the first reflector comprises a layer configured to absorb light of the predetermined wavelength.

5. The system of claim 4, wherein;
    the first reflector further comprises a multilayer film; and
    the layer configured to absorb light of the predetermined wavelength is situated on the multilayer film.

6. The system of claim 4, wherein the layer configured to absorb light of the predetermined wavelength comprises a material selected from the group consisting of silicon dioxide, carbon, zirconium, silicon carbide, silicon nitride, boron carbide, boron nitride, and combinations thereof.

7. The system of claim 1, wherein:
    the first reflector comprises (i) a multilayer film and (ii) a layer or membrane disposed on the multilayer film;
    the multilayer film has a reflective surface, and the layer or membrane has a reflective surface; and
    the reflective surface of the multilayer film is inclined relative to the reflective surface of the layer or membrane.

8. The system of claim 7, wherein the layer or membrane comprises a material selected from the group consisting of silicon, silicon carbide, silicon nitride, and combinations thereof.

9. The system of claim 1, configured to use exposure light, having a wavelength different from the predetermined wavelength, for projecting an image of the pattern on the first surface onto the second surface, wherein the predetermined reflectance is reflectance to the exposure light.

10. The system of claim 9, wherein the exposure light is EUV light.

11. An exposure apparatus, comprising a projection-optical system as recited in claim 1.

12. A microelectronic-device manufacturing process, comprising:
(a) preparing a substrate;
(b) processing the substrate; and
(c) assembling microelectronic devices formed on the substrate during steps (a) and (b), wherein step (b) comprises the steps of (i) applying a resist to the substrate; (ii) exposing the resist; and (iii) developing the resist; and step (ii) comprises providing a exposure apparatus as recited in claim 11, and using the exposure apparatus to expose the resist with the pattern defined on the reticle.

13. A projection-optical system for projecting an image of a pattern from a first surface onto a second surface, the system comprising:
a first reflector and a second reflector situated along a light-propagation path extending from the first surface to the second surface, wherein
the first reflector has a reflectance, for light of a predetermined wavelength, that is less than a predetermined reflectance;
the second reflector has a reflectance, for light of the predetermined wavelength, that is greater than the predetermined reflectance; and
along the light-propagation path the second reflector is situated at a location of maximal illuminance.

14. The system of claim 13, further comprising at least one additional reflector, wherein:
along the light-propagation path at least one reflector of the system is situated closer than the second reflector to the first surface; and
the at least one reflector situated closer to the first surface includes the first reflector.

15. The system of claim 13, further comprising at least one additional reflector, wherein, along the light-propagation path and among the reflectors of the system, the reflector situated closest to the first surface is the first reflector.

16. The system of claim 13, further comprising at least one additional first reflector, wherein, along the light-propagation path the first reflectors are situated closer than the second reflector to the first surface.

17. The system of claim 13, wherein the reflectance of the first reflector to light of the predetermined wavelength is less than half the reflectance of the second reflector to light of the predetermined wavelength.

18. The system of claim 13, configured to use exposure light, having a wavelength different from the predetermined wavelength, for projecting an image of the pattern on the first surface onto the second surface, wherein the predetermined reflectance is reflectance to the exposure light.

19. The system of claim 18, wherein the exposure light is EUV light.

20. The system of claim 13, wherein the first reflector comprises a layer configured to absorb light of the predetermined wavelength.

21. The system of claim 20, wherein;
the first reflector further comprises a multilayer film; and
the layer configured to absorb light of the predetermined wavelength is situated on the multilayer film.

22. The system of claim 20, wherein the layer configured to absorb light of the predetermined wavelength comprises a material selected from the group consisting of silicon dioxide, carbon, zirconium, silicon carbide, silicon nitride, boron carbide, boron nitride, and combinations thereof.

23. The system of claim 13, wherein:
the first reflector comprises (i) a multilayer film and (ii) a layer or membrane disposed on the multilayer film; the multilayer film has a reflective surface, and the layer or membrane has a reflective surface; and
the reflective surface of the multilayer film is inclined relative to the reflective surface of the layer or membrane.

24. The system of claim 23, wherein the layer or membrane comprises a material selected from the group consisting of silicon, silicon carbide, silicon nitride, and combinations thereof.

25. An exposure apparatus, comprising a projection-optical system as recited in claim 13.

26. A microelectronic-device manufacturing process, comprising:
(a) preparing a substrate;
(b) processing the substrate; and
(c) assembling microelectronic devices formed on the substrate during steps (a) and (b), wherein step (b) comprises the steps of (i) applying a resist to the substrate; (ii) exposing the resist; and (iii) developing the resist; and step (ii) comprises providing a exposure apparatus as recited in claim 25, and using the exposure apparatus to expose the resist with the pattern defined on the reticle.

27. A projection-optical system for projecting an image of a pattern from a first surface onto a second surface, the system comprising:
multiple reflectors situated along a light-propagation path extending from the first surface to the second surface, the reflectors including a first reflector and a second reflector, wherein
the first reflector has a reflectance, for light of a predetermined wavelength, that is less than a predetermined reflectance;
the second reflector has a reflectance, for light of the predetermined wavelength, that is greater than the predetermined reflectance; and
along the light-propagation path the second reflector is situated in a vicinity of a location at which an intermediate image is formed by the system.

28. The system of claim 27, further comprising at least one additional reflector, wherein:
along the light-propagation path at least one reflector of the system is situated closer than the second reflector to the first surface; and
the at least one reflector situated closer to the first surface includes the first reflector.

29. The system of claim 27, further comprising at least one additional reflector, wherein, along the light-propagation path and among the reflectors of the system, the first reflector is situated closest to the first surface.

30. The system of claim 27, wherein:
the system comprises multiple first reflectors; and
along the light-propagation path and among the reflectors of the system, the first reflectors are situated closer than the second reflector to the first surface.

31. The system of claim 27, wherein the reflectance of the first reflector to light of the predetermined wavelength is less than half the reflectance of the second reflector to light of the predetermined wavelength.

32. The system of claim 27, configured to use exposure light, having a wavelength different from the predetermined wavelength, for projecting an image of the pattern on the first surface onto the second surface, wherein the predetermined reflectance is reflectance to the exposure light.

33. The system of claim 32, wherein the exposure light is EUV light.

34. The system of claim 27, wherein the first reflector comprises a layer configured to absorb light of the predetermined wavelength.

35. The system of claim 34, wherein;
the first reflector further comprises a multilayer film; and
the layer configured to absorb light of the predetermined wavelength is situated on the multilayer film.

36. The system of claim 34, wherein the layer configured to absorb light of the predetermined wavelength comprises a material selected from the group consisting of silicon dioxide, carbon, zirconium, silicon carbide, silicon nitride, boron carbide, boron nitride, and combinations thereof.

37. The system of claim 27, wherein:
the first reflector comprises (i) a multilayer film and (ii) a layer or membrane disposed on the multilayer film;
the multilayer film has a reflective surface, and the layer or membrane has a reflective surface; and
the reflective surface of the multilayer film is inclined relative to the reflective surface of the layer or membrane.

38. The system of claim 37, wherein the layer or membrane comprises a material selected from the group consisting of silicon, silicon carbide, silicon nitride, and combinations thereof.

39. An exposure apparatus, comprising a projection-optical system as recited in claim 27.

40. A microelectronic-device manufacturing process, comprising:
(a) preparing a substrate;
(b) processing the substrate; and
(c) assembling microelectronic devices formed on the substrate during steps (a) and (b), wherein step (b) comprises the steps of (i) applying a resist to the substrate; (ii) exposing the resist; and (iii) developing the resist; and step (ii) comprises providing a exposure apparatus as recited in claim 39, and using the exposure apparatus to expose the resist with the pattern defined on the reticle.

41. A projection-optical system for projecting an image of a pattern from a first surface onto a second surface, the system comprising:
multiple reflectors situated along a light-propagation path extending from the first surface to the second surface, the multiple reflectors including a first reflector and a second reflector, wherein
the first reflector has a reflectance, for light of a predetermined wavelength, that is less than a predetermined reflectance;
the second reflector has a reflectance, for light of the predetermined wavelength, that is greater than the predetermined reflectance;
with respect to each of the reflectors of the system, (i) a first point-reflecting region is a region, on the reflector, at which a light beam collected at a predetermined first point on the second surface is reflected, (ii) a second point-reflecting region is a region, on the reflector, at which a light beam collected at a second point, different from the first point, on the second surface is reflected, and (iii) a common-reflecting region is a region, on the reflector, in which the first point-reflecting region and the second point-reflecting region overlap;
of the multiple reflectors of the system, a subset comprises reflectors each having a respective common-reflection region in which a portion corresponding to the first point-reflecting region is lower than a predetermined percentage; and
one of the reflectors in the subset is the second reflector that is situated, along the light-propagation path, closest to the first surface of all the reflectors in the subset.

42. The system of claim 41, wherein:
the multiple reflectors further comprise at least one additional reflector;
at least one reflector is situated, along the light-propagation path, closer to the first surface than the second reflector in the subset; and
the at least one closer reflector includes the first reflector.

43. The system of claim 41, wherein:
the multiple reflectors further comprise at least one additional reflector; and
along the light-propagation path and of the reflectors in the system, the first reflector is situated closest to the first surface.

44. The system of claim 41, wherein:
the multiple reflectors comprise multiple first reflectors and at least one additional reflector; and
along the light-propagation path and of the reflectors in the system, the first reflectors are situated closest to the first surface.

45. The system of claim 41, wherein all reflectors, having respective common-reflection regions in which respective portions corresponding to the first point-reflecting region are lower than the predetermined percentage, are second reflectors.

46. The system of claim 41, wherein at least one of the reflectors, having respective common-reflection regions in which respective portions corresponding to the first point-reflecting region are lower than the predetermined percentage, is a first reflector.

47. The system of claim 41, wherein all reflectors, having respective common-reflection regions in which respective portions corresponding to the first point-reflecting region are higher than the predetermined percentage, are first reflectors.

48. The system of claim 41, further defining an arc-shaped exposure region of a predetermined width, wherein:
the first point-reflection region is a first end of an arc passing through a widthwise center of the arc-shaped exposure region;
the second point-reflection region is a second end of the arc passing through the widthwise center of the arc-shaped exposure region;
among the reflectors having respective common-reflection regions in which respective portions corresponding to the first point-reflecting region are lower than the predetermined percentage, the reflector situated closest, along the light-propagation path, to the first surface is a second reflector.

49. The system of claim 48, wherein:
among the reflectors, having respective common-reflection regions in which respective portions corresponding to the first point-reflecting region are lower than the predetermined percentage, is at least one deflector of which the percentage of the common-reflection region corresponding to the first point-reflecting region is substantially zero; and
the reflector situated closest, along the light-propagation path, to the first surface is the second reflector.

50. The system of claim 41, configured to use exposure light, having a wavelength different from the predetermined wavelength, for projecting an image of the pattern on the first surface onto the second surface, wherein the predetermined reflectance is reflectance to the exposure light.

51. The system of claim 50, wherein the exposure light is EUV light.

52. The system of claim 41, wherein the reflectance of the first reflector to light of the predetermined wavelength is less than half the reflectance of the second reflector to light of the predetermined wavelength.

53. The system of claim 41, wherein the first reflector comprises a layer configured to absorb light of the predetermined wavelength.

54. The system of claim 53, wherein;
the first reflector further comprises a multilayer film; and
the layer configured to absorb light of the predetermined wavelength is situated on the multilayer film.

55. The system of claim 53, wherein the layer configured to absorb light of the predetermined wavelength comprises a material selected from the group consisting of silicon dioxide, carbon, zirconium, silicon carbide, silicon nitride, boron carbide, boron nitride, and combinations thereof.

56. The system of claim 41, wherein:
the first reflector comprises (i) a multilayer film and (ii) a layer or membrane disposed on the multilayer film;
the multilayer film has a reflective surface, and the layer or membrane has a reflective surface; and
the reflective surface of the multilayer film is inclined relative to the reflective surface of the layer or membrane.

57. The system of claim 56, wherein the layer or membrane comprises a material selected from the group consisting of silicon, silicon carbide, silicon nitride, and combinations thereof.

58. An exposure apparatus, comprising a projection-optical system as recited in claim 41.

59. A microelectronic-device manufacturing process, comprising:
(a) preparing a substrate;
(b) processing the substrate; and
(c) assembling microelectronic devices formed on the substrate during steps (a) and (b), wherein step (b) comprises the steps of (i) applying a resist to the substrate; (ii) exposing the resist; and (iii) developing the resist; and step (ii) comprises providing a exposure apparatus as recited in claim 58, and using the exposure apparatus to expose the resist with the pattern defined on the reticle.

60. A projection-optical system for projecting an image of a pattern from a first surface onto a second surface, the system comprising along a light-propagation path from the first surface to the second surface:
a first reflector having a particular reflectance for light of a predetermined wavelength; and
a second reflector having a reflectance, greater than the reflectance of the first reflector, for light of the predetermined wavelength.

61. The system of claim 60, wherein the first reflector is situated, along the light-propagation path, closer than the second reflector to the first surface.

62. The system of claim 60, comprising multiple reflectors, including at least one first reflector and at least one second reflector, along the light-propagation path, wherein a first reflector is situated closest to the first surface.

63. The system of claim 60, wherein:
the first reflector and the second reflector have respective illuminances; and
the illuminance at the first reflector is less than the illuminance at the second reflector.

64. The system of claim 60, wherein the second reflector is situated, along the light-propagation path, at a location at which illuminance is highest.

65. The system of claim 60, wherein:
the system is configured to form, at a location along the light-propagation path, an intermediate image; and
the second reflector is located in the vicinity of the intermediate-image location.

66. The system of claim 60, wherein, with respect to each of the reflectors of the system;
a first point-reflecting region is a region, on the reflector, at which a light beam collected at a predetermined first point on the second surface is reflected;
a second point-reflecting region is a region, on the reflector, at which a light beam collected at a second point, different from the first point, on the second surface is reflected;
a common-reflecting region is a region, on the reflector, in which the first point-reflecting region and the second point-reflecting region overlap;
a common-region percentage is the percentage of the common-reflecting region corresponding to the first point-reflecting region; and
the common-region percentage of the first reflector is higher than the common-region percentage of the second reflector.

67. The system of claim 66, further defining an arc-shaped exposure region of a predetermined width, wherein:
the first point-reflection region is a first end of an arc passing through a widthwise center of the arc-shaped exposure region; and
the second point-reflection region is a second end of the arc passing through the widthwise center of the arc-shaped exposure region.

68. The system of claim 67, wherein:
multiple reflectors of the system have respective common-region percentages of substantially zero; and
among the reflectors having substantially zero common-region percentages, the reflector that is situated closest, along the light-propagation path, to the first surface is a second reflector.

69. The system of claim 60, configured to utilize an exposure light, having a wavelength different from the predetermined wavelength, for projection of an image of the pattern on the first surface onto the second surface.

70. The system of claim 69, wherein the exposure light is EUV light.

71. The system of claim 60, wherein the reflectance of the first reflector to light of the predetermined wavelength is less than half the reflectance of the second reflector to light of the predetermined wavelength.

72. The system of claim 60, wherein the first reflector comprises a layer configured to absorb light of the predetermined wavelength.

73. The system of claim 72, wherein;
the first reflector further comprises a multilayer film; and
the layer configured to absorb light of the predetermined wavelength is situated on the multilayer film.

74. The system of claim 73, wherein the layer configured to absorb light of the predetermined wavelength comprises a material selected from the group consisting of silicon dioxide, carbon, zirconium, silicon carbide, silicon nitride, boron carbide, boron nitride, and combinations thereof.

75. The system of claim 60, wherein:
the first reflector comprises (i) a multilayer film and (ii) a layer or membrane disposed on the multilayer film;
the multilayer film has a reflective surface, and the layer or membrane has a reflective surface; and
the reflective surface of the multilayer film is inclined relative to the reflective surface of the layer or membrane.

76. The system of claim 75, wherein the layer or membrane comprises a material selected from the group consisting of silicon, silicon carbide, silicon nitride, and combinations thereof.

77. An exposure apparatus, comprising a projection-optical system as recited in claim 60.

78. A microelectronic-device manufacturing process, comprising:
(a) preparing a substrate;
(b) processing the substrate; and
(c) assembling microelectronic devices formed on the substrate during steps (a) and (b), wherein step (b) comprises the steps of (i) applying a resist to the substrate; (ii) exposing the resist; and (iii) developing the resist; and step (ii) comprises providing a exposure apparatus as recited in claim 77, and using the exposure apparatus to expose the resist with the pattern defined on the reticle.

* * * * *